United States Patent
Schuh et al.

(10) Patent No.: US 11,861,228 B2
(45) Date of Patent: Jan. 2, 2024

(54) MEMORY STATUS COMMAND AGGREGATION

(71) Applicant: Micron Technology, Inc., Boise, ID (US)

(72) Inventors: Karl D. Schuh, Santa Cruz, CA (US); Ali Mohammadzadeh, Mountain View, CA (US); Dheeraj Srinivasan, San Jose, CA (US); Daniel J. Hubbard, Boise, ID (US); Luca Bert, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 90 days.

(21) Appl. No.: 17/514,267

(22) Filed: Oct. 29, 2021

(65) Prior Publication Data
US 2023/0043418 A1 Feb. 9, 2023

Related U.S. Application Data

(60) Provisional application No. 63/230,500, filed on Aug. 6, 2021.

(51) Int. Cl.
*G06F 3/06* (2006.01)

(52) U.S. Cl.
CPC .......... *G06F 3/0659* (2013.01); *G06F 3/0604* (2013.01); *G06F 3/0653* (2013.01); *G06F 3/0673* (2013.01)

(58) Field of Classification Search
CPC .... G06F 3/0659; G06F 3/0604; G06F 3/0653; G06F 3/0673; G06F 3/061; G06F 3/0611; G06F 3/0613; G06F 3/0655; G06F 3/0679
See application file for complete search history.

(56) References Cited

U.S. PATENT DOCUMENTS

| 10,810,157 | B1 * | 10/2020 | Paterra | G06F 3/067 |
| 2013/0339555 | A1 * | 12/2013 | Schushan | G06F 11/3037 710/19 |
| 2016/0259553 | A1 * | 9/2016 | Buxton | G06F 3/0688 |
| 2017/0123656 | A1 * | 5/2017 | Benisty | G06F 3/0688 |
| 2017/0337953 | A1 * | 11/2017 | Zawodny | G06F 3/0659 |
| 2019/0087129 | A1 | 3/2019 | You | |
| 2020/0050402 | A1 | 2/2020 | Furey et al. | |
| 2020/0183600 | A1 | 6/2020 | Woo et al. | |
| 2020/0387447 | A1 | 12/2020 | Byun | |

FOREIGN PATENT DOCUMENTS

KR 10-2020-0141212 A 12/2020

OTHER PUBLICATIONS

International Search Report and Written Opinion, PCT App. No. PCT/US2022/037197, dated Oct. 28, 2022, 9 pages.

* cited by examiner

*Primary Examiner* — Tracy A Warren
(74) *Attorney, Agent, or Firm* — NICHOLSON DE VOS WEBSTER & ELLIOTT LLP

(57) ABSTRACT

Exemplary methods, apparatuses, and systems include aggregating a plurality of memory status commands Each command of the plurality of memory status commands is assigned a corresponding bit on a memory interface. The plurality of memory status commands are sent in parallel as an aggregate status command to one or more memory components via the memory interface.

20 Claims, 4 Drawing Sheets

MEMORY STATUS COMMAND AGGREGATION

CROSS-REFERENCE TO RELATED APPLICATION

The present application claims the benefit of U.S. Provisional Patent Application No. 63/230,500, filed on Aug. 6, 2021, which is hereby incorporated by reference.

TECHNICAL FIELD

The present disclosure generally relates to tracking the status of memory operations, and more specifically, relates to aggregating memory status requests and issuing aggregated memory status requests in parallel.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
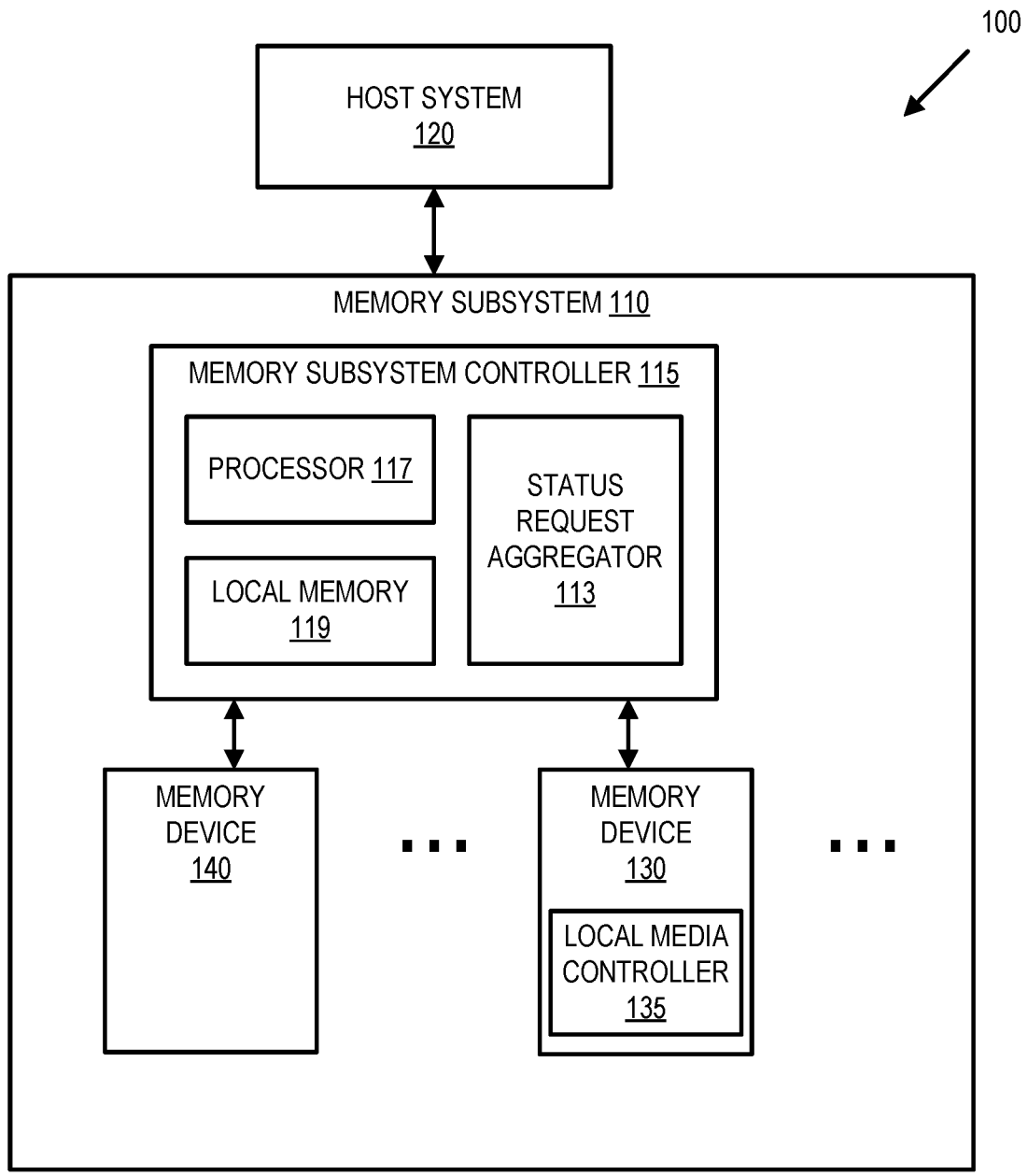
FIG. 1 illustrates an example computing system that includes a memory subsystem in accordance with some embodiments of the present disclosure.

Aspects of the present disclosure are directed to efficient scrambling and encoding for memory operations, including copyback procedures in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Memory subsystems are increasing in density, with a greater number of memory dice per subsystem, and complexity, with a greater number of independent portions (groups of independent word lines, planes, etc.) within each die. While these increases allow for more storage, improved random reads, and write independence, they also result in an increasing number of endpoints for which a memory subsystem controller tracks the status of memory operations. For example, a sixteen-terabyte memory subsystem can have an eight-channel controller with sixteen die per channel. In managing such a system, the controller sends out sixteen separate operation status commands (e.g., read status commands) to poll the status of the memory components. If each die supported four independent word line groups, the number of operation status commands increases to sixty-four. With sixty-four endpoints to poll, memory interface bandwidth can be consumed by status polling and, as a result, performance and Quality of Service (QoS) suffers.

Aspects of the present disclosure address the above and other deficiencies by aggregating operation status commands and sending them in parallel as an aggregate status command Instead of issuing a separate status command for each die/independent portion of memory and receiving separate responses, a single aggregate status command results in the simultaneous return of status messages from multiple dice/independent portions of memory. For example, if a memory interface channel is implemented as an eight-bit bus, up to eight status commands can be sent in parallel and up to eight status responses can be returned in parallel. As a result of the implementation of aggregate status commands, and the corresponding aggregated responses, the memory subsystem performance and QoS improve.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a status request aggregator 113 that can aggregate memory status commands In some embodiments, the controller 115 includes at least a portion of the status request aggregator 113. For example, the controller 115 can include a processor 117 (processing device) configured to execute instructions stored in local memory 119 for performing the operations described herein. In some embodiments, a status request aggregator 113 is part of the host system 110, an application, or an operating system.

The status request aggregator 113 can aggregate operation status commands and send them in parallel as an aggregate status command Instead of issuing a separate status command for each die/independent portion of memory and receiving separate responses, a single aggregate status command results in the simultaneous return of status messages from multiple dice/independent portions of memory. Further details with regards to the operations of the status request aggregator 113 are described below.

Figure 2:
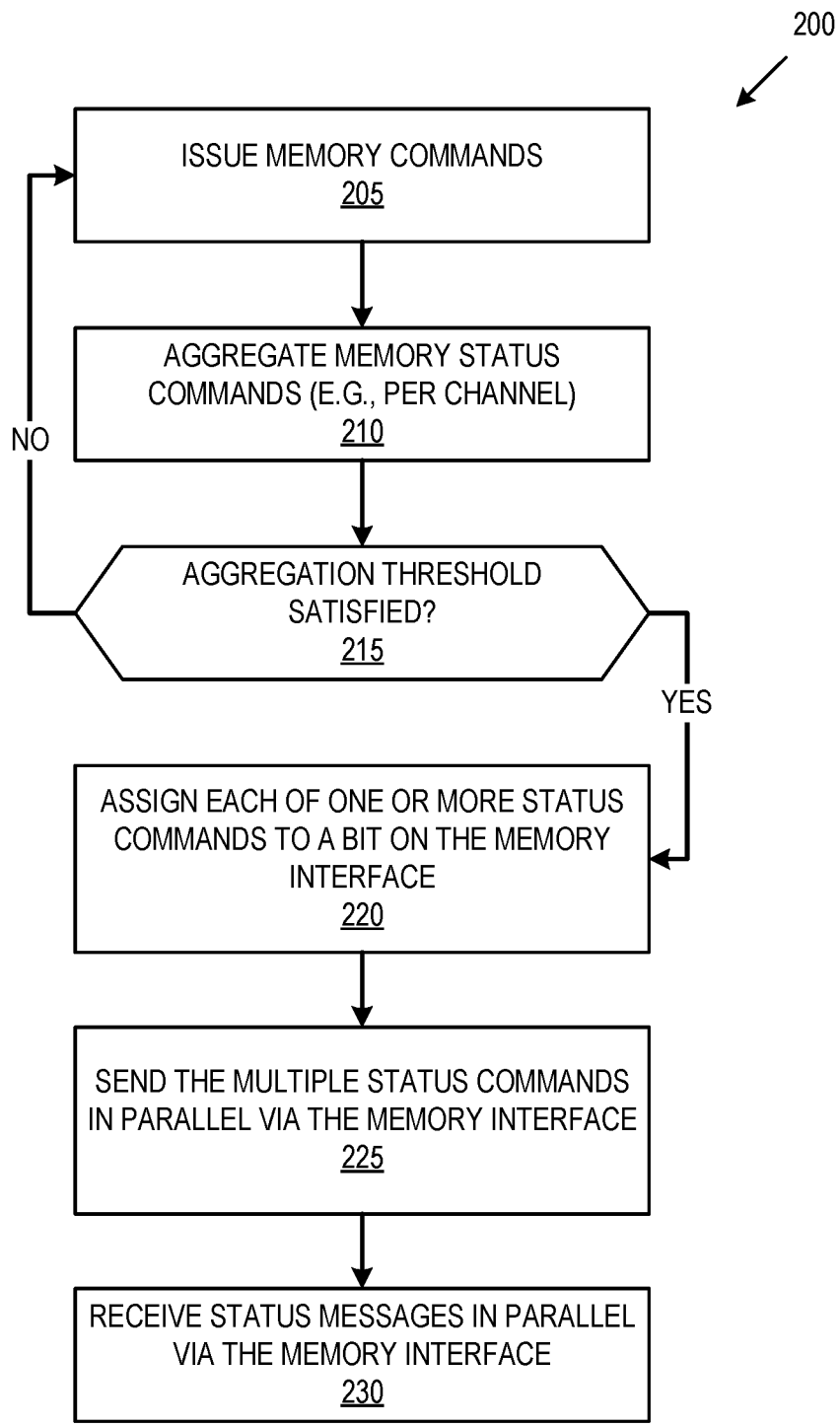
FIG. 2 is a flow diagram of an example method of memory status command aggregation in accordance with some embodiments of the present disclosure.

FIG. 2 is a flow diagram of an example method of memory status command aggregation in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the status request aggregator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device issues memory commands For example, in response to host requests to read and/or write data from/to memory, the processing device determines memory components targeted by the requests based upon an addressing scheme and issues read and/or write operation commands to the corresponding memory components. These requests can be received from one or more host systems and/or generated by a process within the memory subsystem 110. The processing device can receive memory operation requests asynchronously, continuously, in batches, etc. In one embodiment, the memory subsystem 110 receives operation requests from one or more host systems 120 and stores those requests in a command queue.

At operation 210, the processing device aggregates memory status commands For example, a memory status command can request a status value (i.e., status information) for the last memory operation issued, such as one or more memory commands described above with reference to operation 205. The status value can indicate if the last memory operation failed or succeeded. Additionally, a memory status command can request other status values to indicate, e.g., whether or not an array operation is in progress, if the memory component is in a ready state or not, if the memory component is write protected, etc. In one embodiment, the processing device aggregates memory status commands by storing them in a buffer in volatile media (e.g., local memory 119 or a memory device 140). In one embodiment, the processing device aggregates memory status commands per channel. For example, if the memory subsystem 110 includes multiple channels, the processing device temporarily stores memory status commands in groups per channel or otherwise stores them in a manner that allows for tracking and retrieval per channel At operation 215, the processing device determines if an aggregation threshold has been satisfied. For example, the processing device can determine if a number of aggregated memory status commands matches or exceeds the bandwidth (e.g., number of bits) of the memory interface bus used to issue the memory status commands For example, the processing device can increment a counter for each memory status command buffered per channel and determine if the threshold is satisfied by comparing the counter to the channel bandwidth value. In one embodiment, the processing device determines if an aggregation threshold has been reached per channel for multiple channels.

In some embodiments, the processing device can determine if an aggregation threshold has been satisfied based on amount of time that has elapsed. For example, the processing device can stop aggregating memory status commands prior to reaching the bandwidth capacity of a channel upon the expiration of an amount of time. A time-based threshold can be based on a timestamp of a memory command issued, a time elapsed since the last aggregate status command, etc.

If the processing device determines that an aggregation threshold has not been satisfied, method 200 returns to operation returns to operation 205 (or, alternatively, to operation 210) and proceeds as described above. If the processing device determines that an aggregation threshold has been satisfied, method 200 proceeds to operation 220. In an embodiment with multiple channels, method 200 returns to operation 205 for any channels that do not satisfy the aggregation threshold and proceeds to operation 220 for any channels that do satisfy the aggregation threshold.

At operation 220, the processing device assigns each of one or more memory status commands to a corresponding bit on the memory interface bus. For example, the processing device can aggregate and select memory status commands in a first-in-first-out (FIFO) manner In some embodiments, the processing device can prioritize memory status commands based upon memory status command type, to group memory status commands directed to the same memory component (e.g., the same memory die), etc. If a memory channel can transmit eight bits, the processing device selects eight memory status commands and assigns one to each of the bits of the memory channel.

In an embodiment in which multiple memory dice are coupled to the same memory channel, the processing device can divide the bandwidth of the memory interface bus amongst the different memory dice. For example, if eight memory dice are coupled to an eight-bit memory channel, the processing device can assign a memory status command for each die to a different bit of the memory channel In one embodiment, more than one memory status command in the aggregate status command is directed to the same memory component (e.g., memory die or other independent portion of memory). For example, the processing device can send two different memory status command types to the same memory component. Additionally, the processing device can send memory status commands to multiple different independent portions of a larger component (e.g., multiple different independent word line groups/planes within the same memory die).

At operation 225, the processing device issues or otherwise sends the selected memory status commands in parallel, as an aggregated status command, via the memory interface bus. In one embodiment, the processing device sends an indication of which memory component (e.g., memory die or independent portion of memory) is the target of each bit of the aggregated status command For example, prior to or in combination with sending the memory status commands, the processing device instructs the memory components coupled to the channel which memory component is to receive and respond to each individual memory status command on which bit of the memory channel In another embodiment, each memory component is preassigned a bit on the memory interface/channel for receiving and responding to memory status commands At operation 230, the processing device receives memory status messages in parallel (e.g., an aggregated memory status response) via the memory interface bus. For example, each memory component targeted by the aggregated status command can use the expected memory subsystem timing to respond to its corresponding memory status command(s) via the same bit(s) on the memory channel the processing device used to target that memory component. The processing device can track which memory status message is expected on each bit of the channel and manage each of the parallel messages accordingly. Additionally, the processing device can receive multiple consecutive aggregated memory status responses. For example, each memory component targeted by the aggregated status command can respond to its corresponding memory status command(s) via the same bit(s) on the memory channel in a sequence of responses, resulting in a sequence of multiple aggregated memory status responses.

Figure 3:
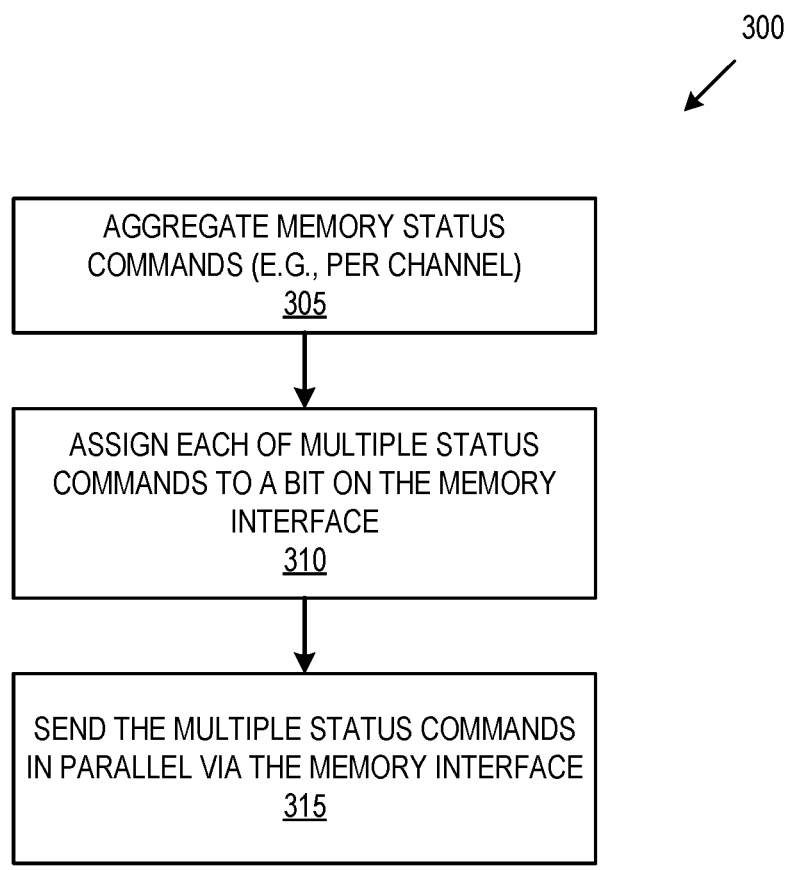
FIG. 3 is a flow diagram of another example method of memory status command aggregation in accordance with some embodiments of the present disclosure.

FIG. 3 is a flow diagram of another example method 300 of memory status command aggregation in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the status request aggregator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device aggregates memory status commands For example, the processing device aggregates memory status commands per channel as describe above with reference to operation 210.

At operation 310, the processing device assigns each of multiple memory status commands to a bit on a memory interface bus. For example, the processing device assigns memory status commands to bits on a memory channel as described above with reference to operation 220.

At operation 315, the processing device sends the multiple memory status commands in parallel, as an aggregated status command, to multiple independent portions of memory via the memory interface bus. For example, the processing device issues the aggregated status command as described above with reference to operation 225.

Figure 4:
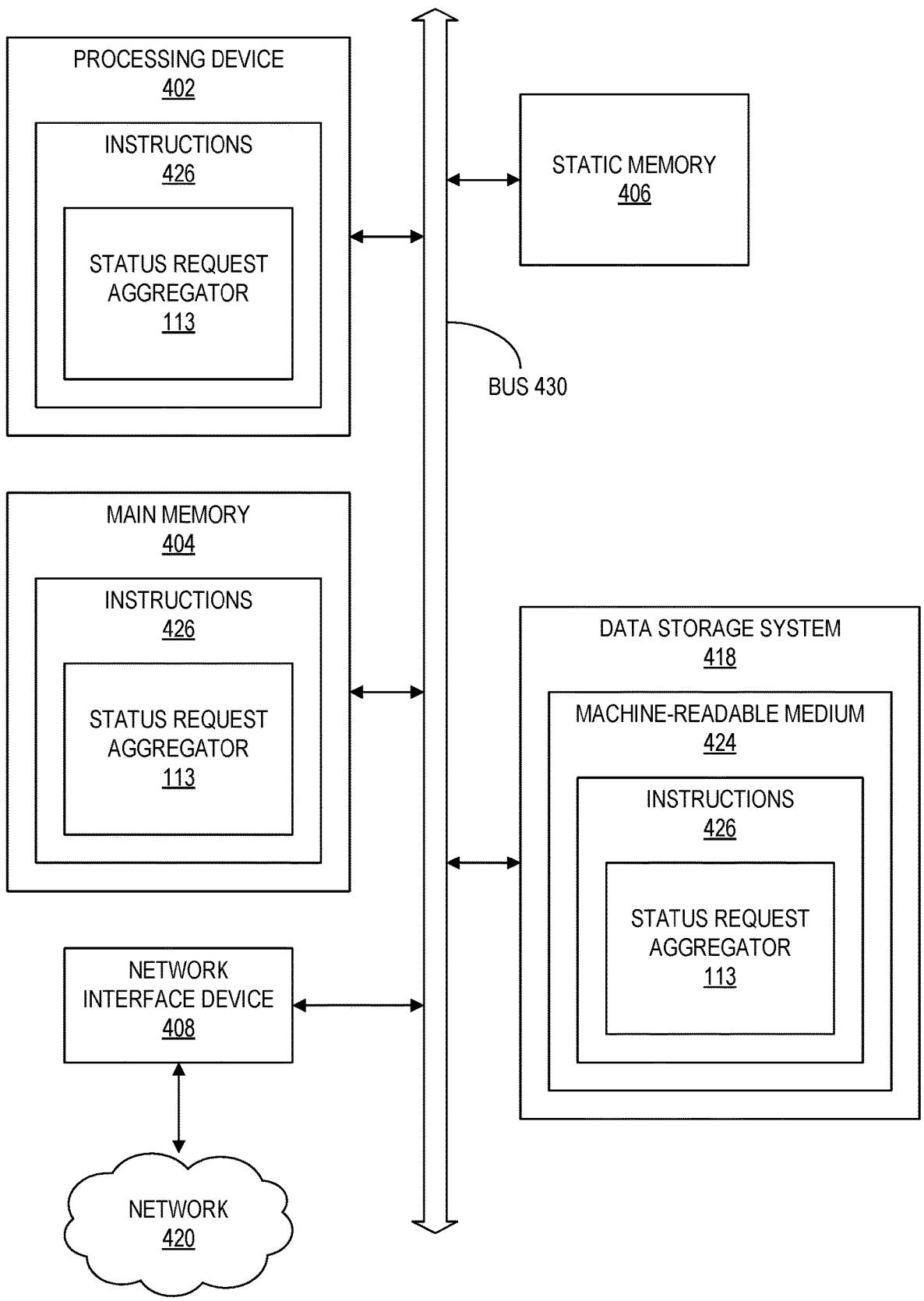
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the status request aggregator 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a status request aggregator (e.g., the status request aggregator 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    aggregating a plurality of memory status commands, wherein the plurality of memory status commands includes a first memory status command and a second memory status command, the first and second memory status commands differing from one another;
    assigning each command of the plurality of memory status commands a corresponding bit on a memory interface; and sending the plurality of memory status commands in parallel as an aggregate status command to one or more memory components via the memory interface.

2. The method of claim 1, wherein the aggregate status command is sent in response to determining an aggregation threshold has been satisfied.

3. The method of claim 1, further comprising:
receiving status messages in response to the aggregate status command, wherein the status messages are received in parallel as an aggregated memory status response via the memory interface.

4. The method of claim 3, wherein the status messages include two or more bits of status information for a single memory die.

5. The method of claim 1, wherein multiple commands of the aggregate status command are directed to independent portions of a same memory die.

6. The method of claim 1, wherein each command of the aggregate status command is directed to a different memory die.

7. The method of claim 1, wherein the memory interface is a first memory channel of multiple memory channels and the aggregating of the plurality of memory status commands includes selecting memory status commands directed to memory coupled to the first memory channel.

8. A non-transitory computer-readable storage medium comprising instructions that, when executed by a processing device, cause the processing device to:
aggregate a plurality of memory status commands, wherein the plurality of memory status commands includes a first memory status command and a second memory status command, the first and second memory status commands differing from one another;
assign each command of the plurality of memory status commands a corresponding bit on a memory interface; and
send the plurality of memory status commands in parallel as an aggregate status command to one or more memory components via the memory interface.

9. The non-transitory computer-readable storage medium of claim 8, wherein the aggregate status command is sent in response to determining an aggregation threshold has been satisfied.

10. The non-transitory computer-readable storage medium of claim 8, wherein the processing device is further to:
receive status messages in response to the aggregate status command, wherein the status messages are received in parallel as an aggregated memory status response via the memory interface.

11. The non-transitory computer-readable storage medium of claim 10, wherein the status messages include two or more bits of status information for a single memory die.

12. The non-transitory computer-readable storage medium of claim 8, wherein multiple commands of the aggregate status command are directed to independent portions of a same memory die.

13. The non-transitory computer-readable storage medium of claim 8, wherein each command of the aggregate status command is directed to a different memory die.

14. The non-transitory computer-readable storage medium of claim 8, wherein the memory interface is a first memory channel of multiple memory channels and the aggregating of the plurality of memory status commands includes selecting memory status commands directed to memory coupled to the first memory channel.

15. A system comprising:
a plurality of memory devices; and
a processing device, operatively coupled with the plurality of memory devices, to:
aggregate a plurality of memory status commands, wherein the plurality of memory status commands includes a first memory status command and a second memory status command, the first and second memory status commands differing from one another;
assign each command of the plurality of memory status commands a corresponding bit on a memory interface; and
send the plurality of memory status commands in parallel as an aggregate status command to one or more memory components via the memory interface in response to determining an aggregation threshold has been satisfied.

16. The system of claim 15, wherein the processing device is further to:
receive status messages in response to the aggregate status command, wherein the status messages are received in parallel as an aggregated memory status response via the memory interface.

17. The system of claim 16, wherein the status messages include two or more bits of status information for a single memory die.

18. The method of claim 1, wherein the plurality of aggregated memory status commands is stored in a buffer until an aggregation threshold is satisfied.

19. The method of claim 18, wherein the aggregation threshold is a number of memory status commands equal to a number of bits of the memory interface.

20. The method of claim 18, wherein the aggregation threshold is a duration of time.

* * * * *